United States Patent
Lee et al.

(10) Patent No.: US 9,553,149 B2
(45) Date of Patent: Jan. 24, 2017

(54) SEMICONDUCTOR DEVICE WITH A STRAINED REGION AND METHOD OF MAKING

(71) Applicant: Taiwan Semiconductor Manufacturing Company Limited, Hsin-Chu (TW)

(72) Inventors: Yi-Jing Lee, Hsinchu (TW);
Cheng-Hsien Wu, Hsinchu (TW);
Chih-Hsin Ko, Fongshan (TW);
Clement Hsingjen Wann, Carmel, NY (US)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/075,189

(22) Filed: Nov. 8, 2013

(65) Prior Publication Data

US 2015/0129979 A1    May 14, 2015

(51) Int. Cl.
*H01L 27/088* (2006.01)
*H01L 29/10* (2006.01)
(Continued)

(52) U.S. Cl.
CPC ..... *H01L 29/1054* (2013.01); *H01L 21/76224* (2013.01); *H01L 29/66795* (2013.01);
(Continued)

(58) Field of Classification Search
CPC ............ H01L 29/66795; H01L 29/785; H01L 29/4238; H01L 27/1214; H01L 51/0545; H01L 27/12; H01L 27/0207; H01L 29/0696; H01L 21/845; H01L 27/10826; H01L 2924/13067; H01L 29/7378; H01L 29/1054
(Continued)

(56) References Cited

U.S. PATENT DOCUMENTS

| 7,504,704 B2 * | 3/2009 | Currie et al. ................ 257/510 |
| 2006/0231892 A1 * | 10/2006 | Furukawa ............... H01L 21/84 257/347 |

(Continued)

OTHER PUBLICATIONS

"Study of Carrier Transport in Strained and Unstrained SOI Tri-gate and Omega-gate Si Nanowire MOSFETs", M. Koyama, M. Casse, R. Coquand, S. Barraud, H. Iwai, G. Ghibaudo and G. Reimbold, Sep. 17-21, 2012, 42nd ESSDRC, Bordeaux, France and Sep. 18, 2012, A2L-E, High Mobility Devices, 30 pgs.
(Continued)

*Primary Examiner* — Thao X Le
*Assistant Examiner* — Nduka Ojeh
(74) *Attorney, Agent, or Firm* — Cooper Legal Group, LLC

(57) ABSTRACT

A semiconductor device with a strained region is provided. The semiconductor device includes a first dielectric layer, a second dielectric layer disposed over the first dielectric layer, the second dielectric layer having a first fin disposed therein and an interface disposed proximate the first fin. The interface includes a first oxide region disposed in the first dielectric layer and a second oxide region disposed in the second dielectric layer. The interface induces strain in a region of the semiconductor device. A method of making a semiconductor device with a strained region is also provided.

20 Claims, 9 Drawing Sheets

(51) Int. Cl.
  *H01L 29/66* (2006.01)
  *H01L 29/78* (2006.01)
  *H01L 21/762* (2006.01)
  *H01L 29/165* (2006.01)

(52) U.S. Cl.
  CPC ........ *H01L 29/785* (2013.01); *H01L 29/7846* (2013.01); *H01L 29/165* (2013.01)

(58) Field of Classification Search
  USPC ................ 257/401, 213, E51.005, E29.193; 438/FOR. 163, FOR. 174, FOR. 424
  See application file for complete search history.

(56) References Cited

U.S. PATENT DOCUMENTS

| | | | |
|---|---|---|---|
| 2009/0004806 A1* | 1/2009 | Siprak | ............................ 438/306 |
| 2010/0044754 A1 | 2/2010 | Boyanov et al. | |
| 2011/0097863 A1 | 4/2011 | Shieh et al. | |
| 2011/0193175 A1* | 8/2011 | Huang | ............ H01L 21/823431 257/386 |
| 2011/0198695 A1* | 8/2011 | Anderson | ............. H01L 21/845 257/347 |
| 2013/0113026 A1 | 5/2013 | Huang et al. | |
| 2013/0119370 A1 | 5/2013 | Wu et al. | |
| 2013/0196483 A1* | 8/2013 | Dennard | ........... H01L 29/78603 438/458 |
| 2013/0228862 A1 | 9/2013 | Lee et al. | |
| 2013/0248927 A1 | 9/2013 | Wu et al. | |
| 2013/0248948 A1 | 9/2013 | Ma et al. | |

OTHER PUBLICATIONS

Takagi, et al., "Fabrication and device characteristics of strained-Si-on-insulator (strained-SOI) CMOS", Published in 2003, Applied Surface Science 224 (2004) 241-247.

* cited by examiner

SEMICONDUCTOR DEVICE WITH A STRAINED REGION AND METHOD OF MAKING

BACKGROUND

A transistor, such as a FinFET transistor, comprises a source region, a drain region, and a channel region between the source region and the drain region. For a FinFET transistor, the channel region is formed as a fin structure. The transistor comprises a gate region that controls the channel region to operate the transistor. The gate region is formed around one or more surfaces of the channel region, which provides the gate region with increased control over the channel region.

DETAILED DESCRIPTION

Figure 1:
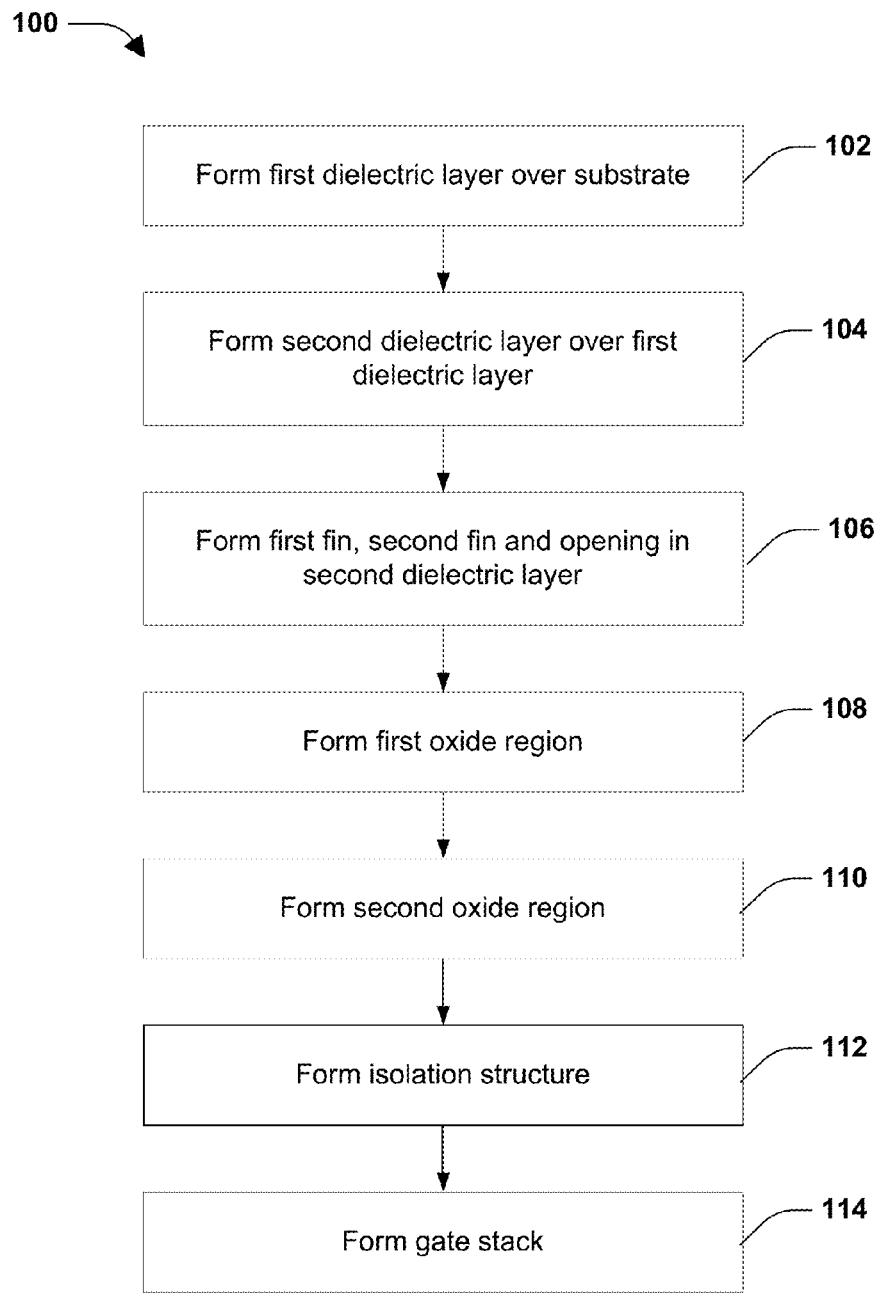
FIG. 1 is a flow diagram illustrating a method for fabricating a semiconductor device, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more semiconductor devices and one or more methods for forming such semiconductor devices are provided herein. In some embodiments, a semiconductor device includes a multi-gate transistors or fin-type multi-gate transistors referred to as finFET devices. In some embodiments, the semiconductor device includes a fin that functions as a channel. In some embodiments, the semiconductor device includes an interface. In some embodiments, the interface includes a first oxide region and a second oxide region. In some embodiments, the interface provides a stress or a strain on the device. In some embodiments, the stress or strain enhances electron mobility and alters the performance of the semiconductor device.

Referring to FIG. 1, illustrated is a flow diagram of a method 100 for fabricating a semiconductor device with a strained region according to some embodiments. Referring also to FIGS. 2 to 9, illustrated are cross-sectional views of a semiconductor device 200 at various stages of fabrication according to some embodiments, such as according to the method 100 of FIG. 1. In some embodiments, part of the semiconductor device 200 is fabricated with a CMOS process flow. In some embodiments, additional processes are provided before, during, and after the method 100 of FIG. 1.

Figure 2:
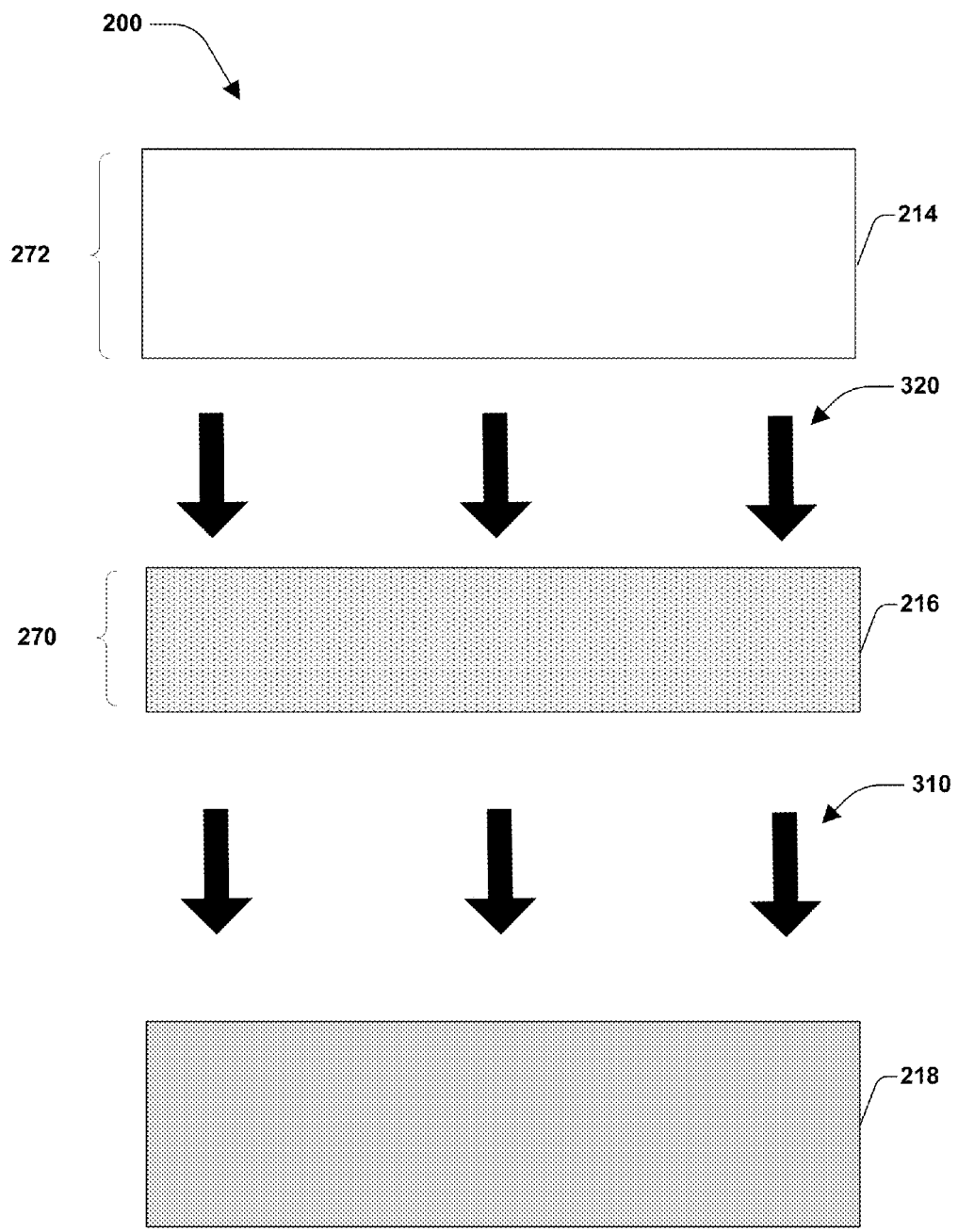
FIG. 2 is a cross-sectional view of a semiconductor device during fabrication, according to some embodiments.
Figure 3:
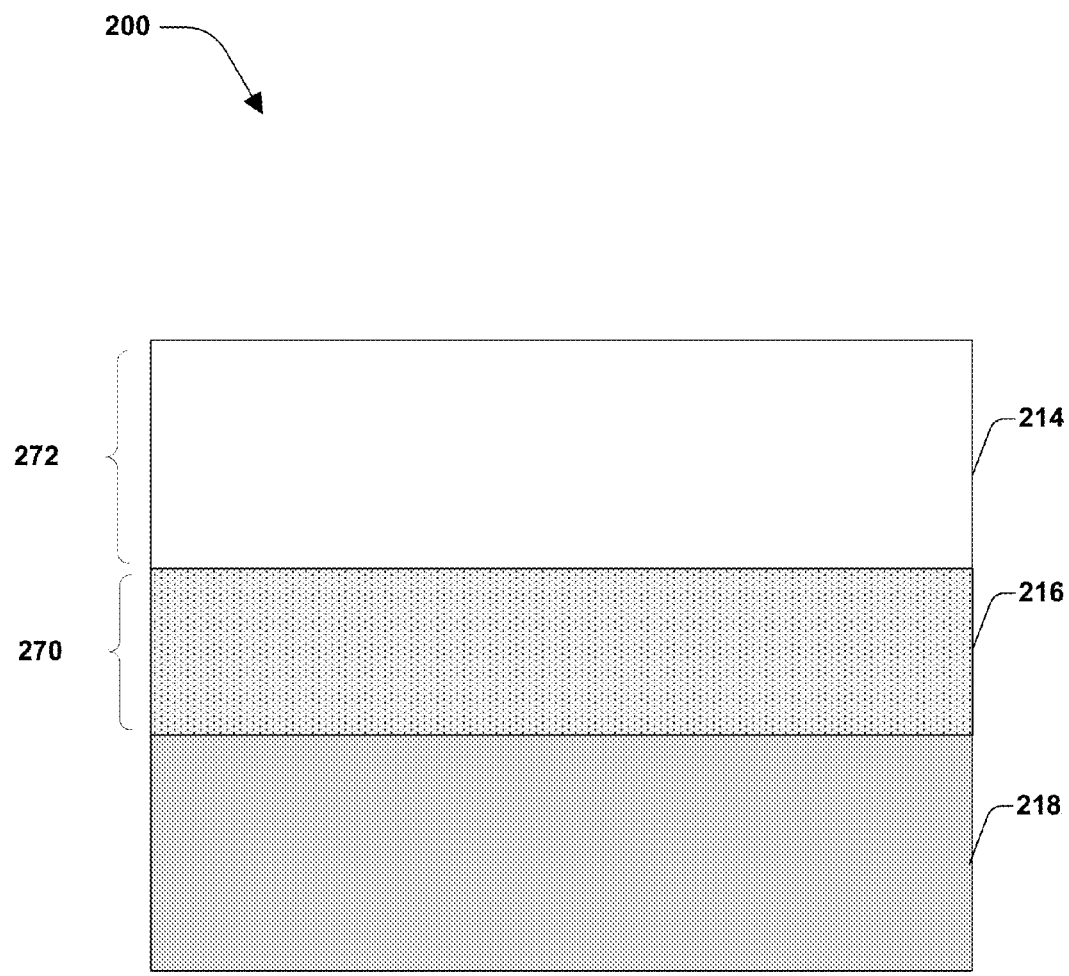
FIG. 3 is a cross-sectional view of a semiconductor device during fabrication, according to some embodiments.

At 102, a first dielectric layer 216 is formed over a substrate 218, as illustrated in FIG. 2 and FIG. 3. In some embodiments, the substrate 218 is a silicon substrate. In some embodiments, the substrate 218 is at least one of silicon germanium, silicon carbide, gallium arsenic, gallium phosphide, indium phosphide, indium arsenide, indium antimonide or other suitable semiconductor material. In some embodiments, the substrate 218 includes one or more doped regions, such as at least one of a P-well or a N-well. In some embodiments, the substrate 218 is a semiconductor on an insulator such as silicon on insulator (SOI).

In some embodiments, the first dielectric layer 216 is an epitaxial layer. In some embodiments, the first dielectric layer 216 includes silicon germanium (SiGe). In some embodiments, the first dielectric layer 216 has a germanium content of about 20 to about 50%. In some embodiments, the first dielectric layer 216 includes at least one of silicon carbide (SiC), silicon phosphorus carbide (SiPC) or silicon phosphorus (SiP). In some embodiments, the first dielectric layer 216 includes a metal. In some embodiments, the first dielectric layer includes at least one of germanium, gallium arsenide, gallium nitride or aluminum gallium indium phosphide.

In some embodiments, the first dielectric layer 216 is formed by a first process 310. In some embodiments, the first process 310 includes at least one of a condensation process or a growth process. In some embodiments, the first dielectric layer 216 is grown on the substrate 218. In some embodiments, the first dielectric layer 216 is grown by at least one of solid-phase epitaxy (SPE) or vapor-phase epitaxy. In some embodiments, an impurity is added to the first dielectric layer 216 during the growth process via in-situ doping. In some embodiments, the impurity includes at least one of arsenic, phosphorous, antimony, boron or boron di-fluoride. In some embodiments, the first dielectric layer 216 has a first thickness 270. In some embodiments, the first thickness 270 is about 20 to about 50 nanometers (nm).

At 104, a second dielectric layer 214 is formed over the first dielectric layer 216, as illustrated in FIG. 2 and FIG. 3. In some embodiments, the second dielectric layer 214 is different than the first dielectric layer 216. In some embodiments, the second dielectric layer 214 is an epitaxial layer. In some embodiments, the second dielectric layer 214 includes silicon. In some embodiments, the second dielectric layer 214 includes at least one of SiC, SiPC or SiP. In some embodiments, the second dielectric layer 214 is formed by a second process 320. In some embodiments, the second process 320 is similar to the first process 310. In some embodiments, the second dielectric layer 214 is grown on the first dielectric layer 218. In some embodiments, the second dielectric layer 214 is grown by at least one of SPE or vapor-phase epitaxy. In some embodiments, an impurity is added to the second dielectric layer 214 during the growth process via in-situ doping. In some embodiments, the impurity includes at least one of arsenic, phosphorous, antimony, boron or boron di-fluoride. In some embodiments, the second dielectric layer 214 has a second thickness 272. In some embodiments, the second thickness 272 is about 20 to about 60 nanometers (nm).

Figure 4:
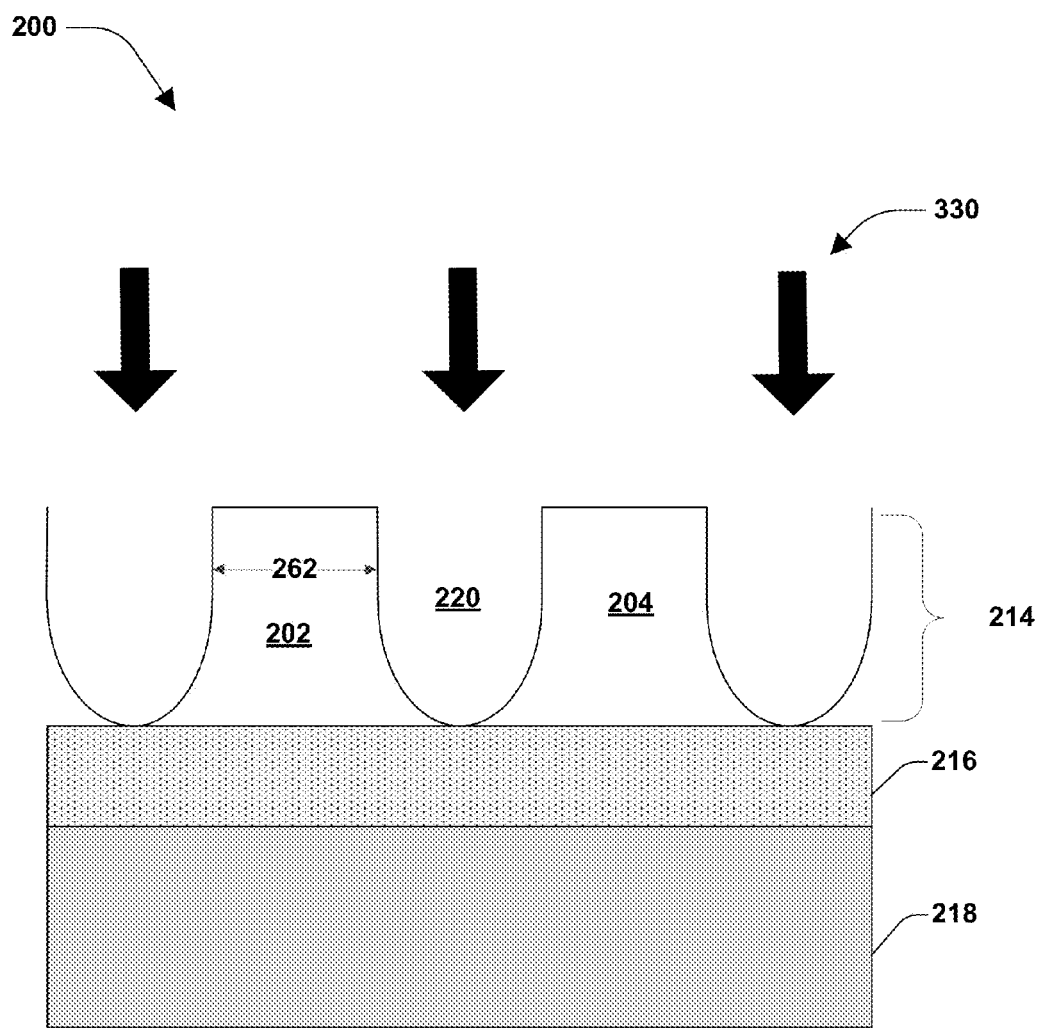
FIG. 4 is a cross-sectional view of a semiconductor device during fabrication, according to some embodiments.

At 106, a portion of the second dielectric layer 214 is removed to form a first fin 202, a second fin 204 and an opening 220, as illustrated in FIG. 4. In some embodiments, the first fin 202, the second fin 204 and the opening 220 are formed by a third process 330. In some embodiments, the third process 330 includes at least one of a photolithography process or an etch process. In some embodiments, the photolithography process includes at least one of forming a photoresist layer overlying the second dielectric layer 214, exposing the photoresist layer to a pattern, performing post-exposure bake processes, and developing the photoresist layer to form a masking element from the photoresist layer. In some embodiments, the etch process is preformed over the masking element and an exposed surface of the second dielectric layer 214. In some embodiments, the etch process forms the opening 220 in the second dielectric layer 214, leaving a first fin 202 and a second fin 204. In some embodiments, the third process 330 includes at least one of a reactive ion etch (RIE), a hydrofluoric acid (HF) etch or a dry etch. In some embodiments, the dry etch includes the use of at least one of $CF_4$, $SF_6$, or $NF_3$. In some embodiments, at least one of the first fin 202 or the second fin 204 has a width 262. In some embodiments, the width 262 is about 10 to about 200 nm. In some embodiments, at least one of a second opening or a third fin is formed in the second dielectric layer 214.

Figure 5:
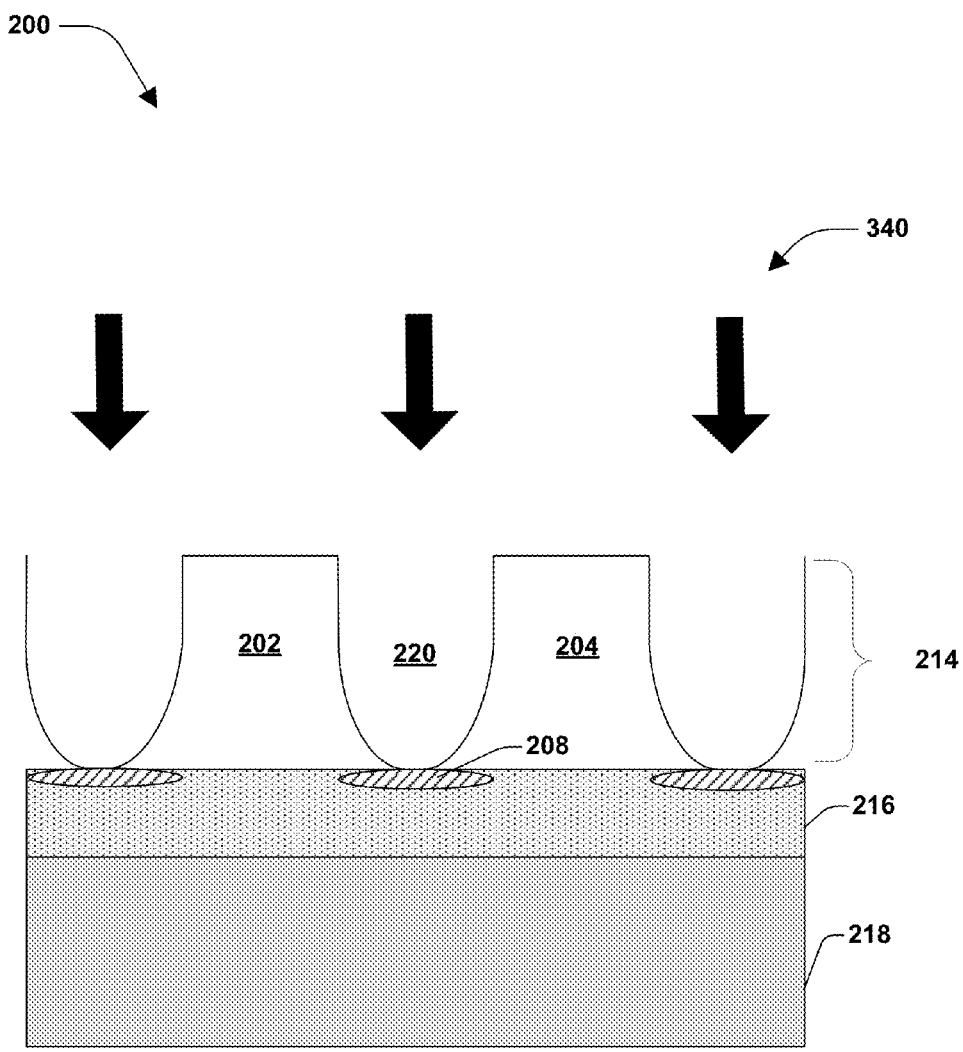
FIG. 5 is a cross-sectional view of a semiconductor device during fabrication, according to some embodiments.

At 108, a first oxide region 208 is formed, as illustrated in FIG. 5. In some embodiments, the first oxide region 208 is formed by a fourth process 340. In some embodiments, the fourth process 340 includes a thermal oxidation process. In some embodiments, the fourth process 340 exposes the semiconductor device 200 to an oxidation source. In some embodiments, the fourth process 340 exposes at least an area of the first dielectric layer 216 under the opening 220 to the oxidation source. In some embodiments, the process 340 exposes the semiconductor device 200 to an oxidation source for a length of time of about 0.25 to about 5 hours. In some embodiments, the process 340 exposes the semiconductor device 200 to an oxidation source for a length of time of about 2 to about 3 hours. In some embodiments, the oxidation source includes at least one of $H_2O$ or O2. In some embodiments, the fourth process 340 is carried out at a temperature of about 300 to about 900° C. In some embodiments, the fourth process 340 is carried out at a temperature of about 500 to about 600° C. In some embodiments, the first oxide region 208 is formed in the first dielectric layer 216 proximate the opening 220. In some embodiments, the first oxide region 208 extends under at least one of the first fin 202 or the second fin 204. In some embodiments, the first oxide region 208 extends up to about 30% of the width of at least one of the first fin 202 or the second fin 204, such that if the width of at least one of the first fin 202 or the second fin 204 is 1 unit of measure, the first oxide region 208 extends under at least one of the first fin 202 or the second fin 204 up to about ⅓ of the unit of measure. In some embodiments, the first oxide region 208 includes SiGeOx. In some embodiments, the SiGeOx includes about 10 to about 50% germanium. In some embodiments, the first oxide region 208 includes at least one of SiCOx or SiPOx. In some embodiments, the first oxide region 208 is about 20 to about 50 nm thick, as measured in a direction from the opening 220 through the first dielectric layer 216 to the substrate 218.

Figure 6:
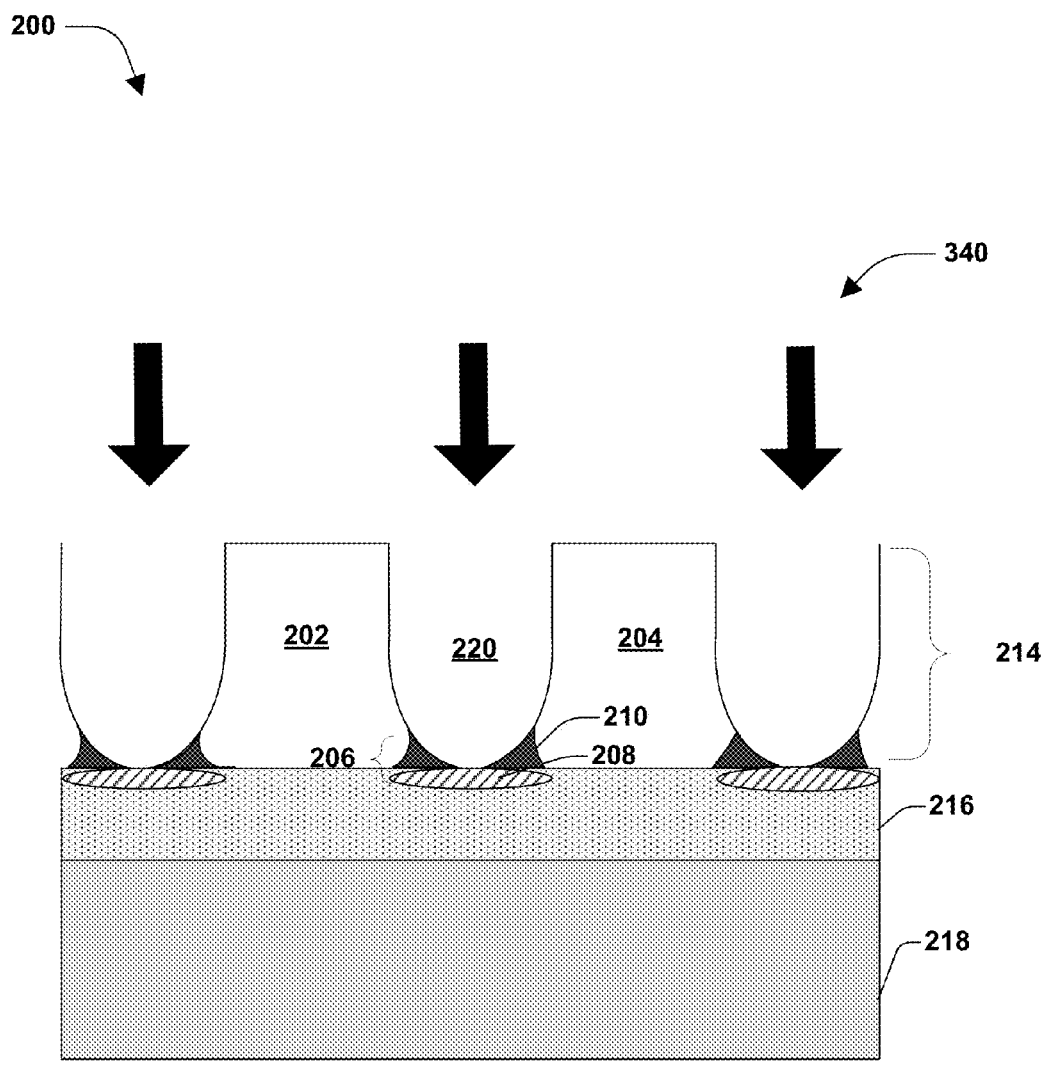
FIG. 6 is a cross-sectional view of a semiconductor device during fabrication, according to some embodiments.

At 110, a second oxide region 210 is formed, as illustrated in FIG. 6. In some embodiments, at least some of the formation of the second oxide region 210 occurs concurrently with at least some of the formation of the first oxide region 208. In some embodiments, at least some of the second oxide region 210 is formed by the fourth process 340, as described above. In some embodiments, at least some of the second oxide region 210 is formed by a fifth process. In some embodiments, the fifth process is a thermal oxidation process. In some embodiments, the second oxide region 210 is formed in the second dielectric layer 214. In some embodiments, the second oxide region 210 is formed proximate the opening 220. In some embodiments, the second oxide region 210 is over the first oxide region 208. In some embodiments, the second oxide region 210 includes SiOx. In some embodiments, the SiOx includes at least one of $SiO_2$ or SiO. In some embodiments, the second oxide region 210 is at least 1 nm thick, as measured in a direction from the opening 220 through the first dielectric layer 216 to the substrate 218.

In some embodiments, the first oxide region 208 and the second oxide region 210 form an interface 206. In some embodiments, the first oxide region 208 includes SiGeOx and the second oxide region 210 includes SiOx. In some embodiments, the interface 206 is located proximate the opening 220. In some embodiments, the interface 206 is configured to form at least one of an arch, a peak, a wave or a planar shaped surface. In some embodiments, the strain level of the semiconductor device 200 is controlled by an oxidation area of the interface 206. In some embodiments, the oxidation area of the interface 206 includes at least one of a first area of the first oxide region 208 or a second area of the second oxide region 210. In some embodiments, the oxidation area is proportionate to at least one of the length of time or the temperature of the fourth process 340. In some embodiments, the oxidation area increases as at least one of the length of time or the temperature of the fourth process 340 increases. In some embodiments, as the oxidation area of the interface increases, the strain level of the semiconductor device 200 increases, and thus the electron mobility of the semiconductor device 200 increases.

Figure 7:
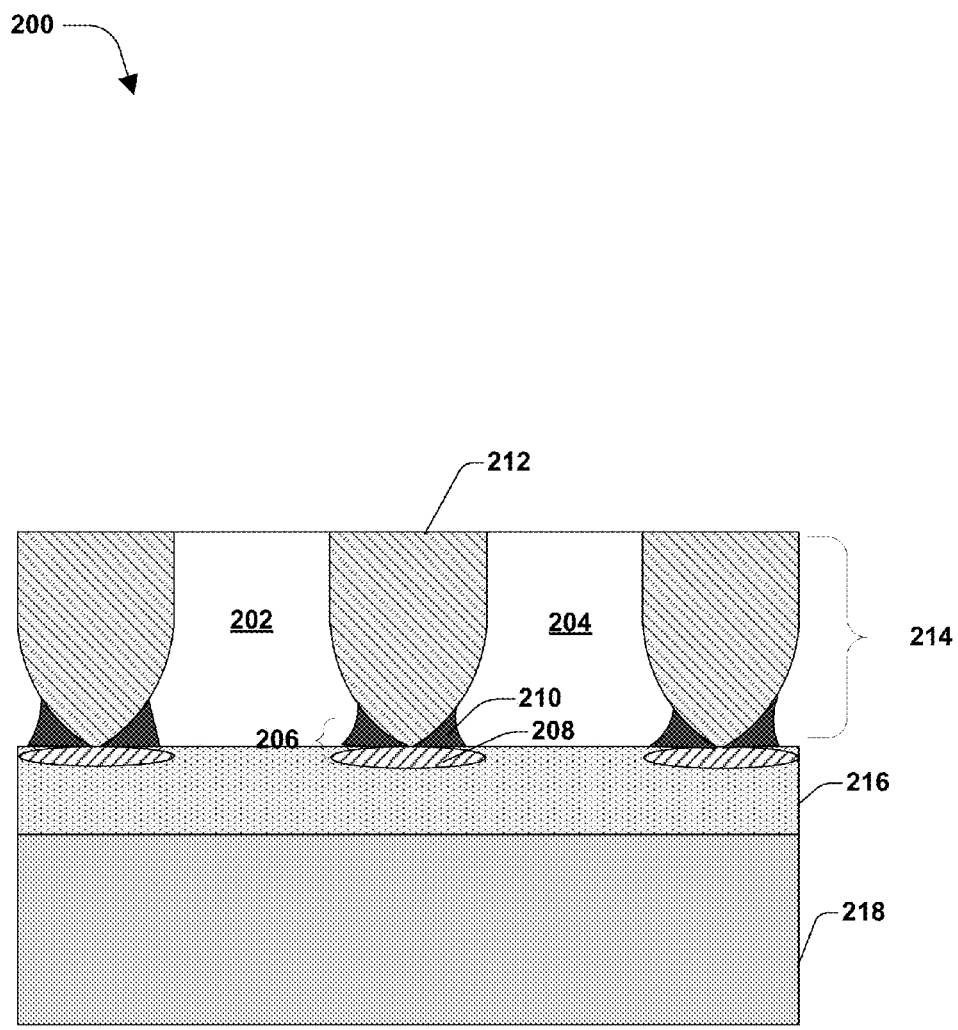
FIG. 7 is a cross-sectional view of a semiconductor device during fabrication, according to some embodiments.
Figure 8:
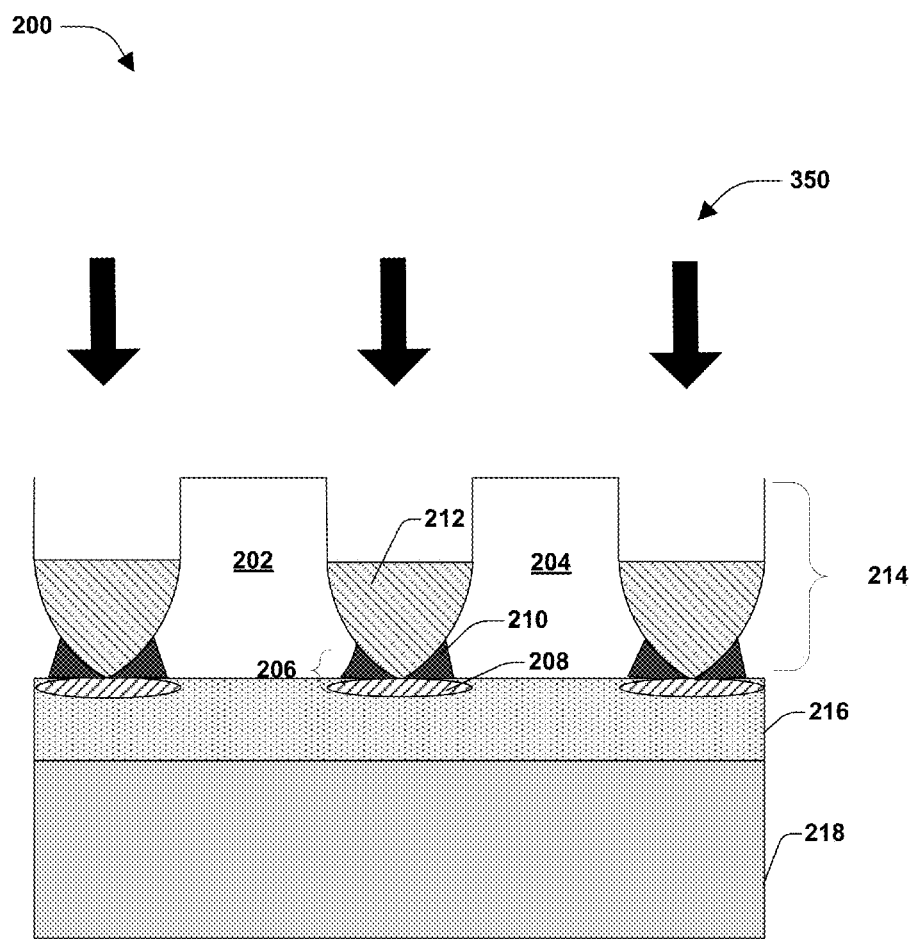
FIG. 8 is a cross-sectional view of a semiconductor device during fabrication, according to some embodiments.

At 112, an isolation structure 212 is formed, as illustrated in FIG. 7. In some embodiments, the isolation structure 212 is a shallow trench isolation (STI) structure. In some embodiments, the isolation structure 212 is disposed between the first fin 202 and the second fin 204. In some embodiments the isolation structure 212 is disposed in the opening 220. In some embodiments, the isolation structure 212 contacts the interface 206. In some embodiments, the isolation structure 212 isolates an active region of the semiconductor device 200. In some embodiments, the active region is configured as at least one of a NMOS device or a PMOS device. In some embodiments, the isolation structure 212 isolates the active region of a NMOS device from the active region of an adjacent device, such as a PMOS device. In some embodiments, the isolation structure 212 includes at least one of silicon oxide, silicon nitride, silicon oxynitride, fluoride-doped silicate glass (FSG) or a low-k dielectric material. In some embodiments, a process 350 is preformed to remove part of the isolation structure 212, as illustrated in FIG. 8. In some embodiments, the process 350 is at least one of an etching processor a chemical mechanical polish (CMP).

Figure 9:
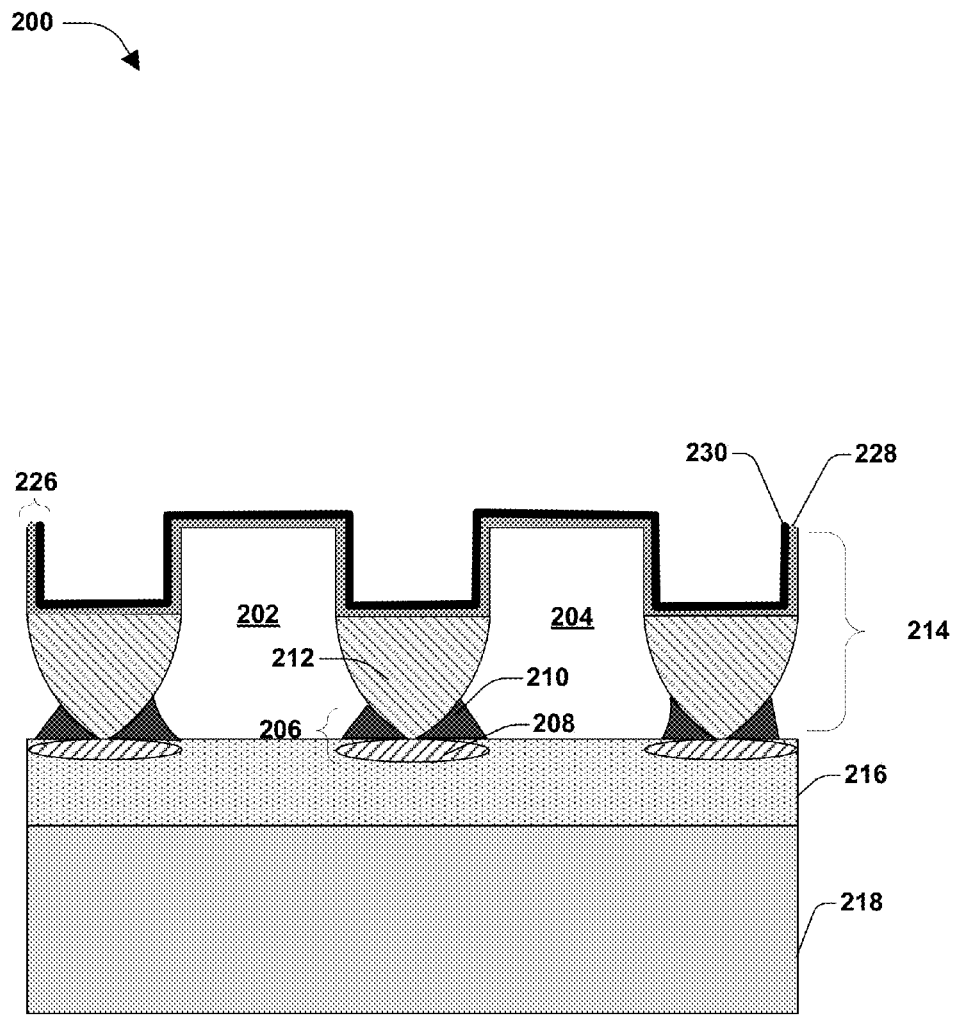
FIG. 9 is a cross-sectional view of a semiconductor device during fabrication, according to some embodiments.

At 114, a gate stack 226 is formed, as illustrated in FIG. 9. In some embodiments, the gate stack 226 includes at least one of a gate dielectric layer 228 or a gate electrode layer 230. In some embodiments, the gate dielectric layer 228 includes at least one of silicon oxide, silicon nitride, silicon oxynitride, or a high-k dielectric material. In some embodiments, the gate dielectric layer 228 has a thickness of about 10 to 30 angstroms. In some embodiments, the gate dielectric layer 228 is formed using at least one of atomic layer deposition (ALD), chemical vapor deposition (CVD), physical vapor deposition (PVD) or thermal oxidation. In some embodiments, the gate dielectric layer 228 includes an interfacial layer (not shown) to inhibit damage between the gate dielectric layer and at least one of the first fin 202 or the second fin 204. In some embodiments, the interfacial layer includes at least one of silicon oxide or silicon oxynitride.

In some embodiments, the gate electrode layer 230 includes at least one of a single layer or a multilayer structure. In some embodiments, the gate electrode layer 230 includes a poly-silicon. In some embodiments, the gate electrode layer 230 includes a doped poly-silicon with at least one of uniform or non-uniform doping. In some embodiments, the gate electrode layer 230 includes a metal. In some embodiments, the gate electrode layer 230 includes at least one of Al, Cu, W, Ti, Ta, TiN, TiAl, TiAlN, TaN, NiSi or CoSi. In some embodiments, the gate electrode layer 230 includes a conductive material with a work function. In some embodiments, the gate electrode layer 230 has a thickness of about 30 nm to about 60 nm. In some embodiments, the gate electrode layer 230 is formed using at least one of an ALD, CVD, PVD or plating process.

In some embodiments, the semiconductor device 200 includes other layers or features not specifically illustrated including at least one of a source region, a drain region, an interlayer dielectric (ILD) layer, a contact, an interconnect or other suitable features. In some embodiments, at least one of the source region or the drain region is formed proximate at least one of the first fin 202 or the second fin 204. In some embodiments, at least one of the source region or the drain region is formed in at least one of the first dielectric layer 216 or the second dielectric layer 214. In some embodiments, the source region is spaced apart from the drain region by at least one of the first fin 202 or the second fin 204. In some embodiments, at least one of the source region or the drain region is formed after the second oxide region 210 is formed. In some embodiments, at least one of the source region or the drain region is formed after the gate stack 226 is formed. In some embodiments, other back end of line (BEOL) processes are preformed on the semiconductor device 200.

According to some aspects of the instant disclosure, a semiconductor device is provided. The semiconductor device comprises a first dielectric layer, a second dielectric layer disposed over the first dielectric layer, the second dielectric layer having a first fin disposed therein and an interface disposed proximate the first fin. The interface comprises a first oxide region disposed in the first dielectric layer and a second oxide region disposed in the second dielectric layer.

According to some aspects of the instant disclosure, a semiconductor device is provided. The semiconductor device comprises a first dielectric layer, a second dielectric layer disposed over the first dielectric layer, the second dielectric layer having a first fin disposed therein and an interface disposed proximate the first fin. The interface comprises a first oxide region disposed in the first dielectric layer and a second oxide region disposed in the second dielectric layer. The first dielectric layer comprises SiGe, the second dielectric layer comprises Si, the first oxide region comprises SiGeOx and the second oxide region comprises SiOx.

According to some aspects of the instant disclosure, a method of fabricating a semiconductor device is provided. The method comprises forming a first dielectric layer over a substrate, forming a second dielectric layer over the first dielectric layer, forming a first fin and a second fin in the second dielectric layer, the first fin separated from the second fin by an opening formed in the second dielectric layer, forming a first oxide region in the first dielectric layer proximate the opening and forming a second oxide region in the second dielectric layer proximate the opening.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed as to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

It will be appreciated that layers, features, elements, etc. depicted herein are illustrated with particular dimensions relative to one another, such as structural dimensions or orientations, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device comprising:
   a first layer;
   a second layer disposed over the first layer, the second layer defining a first fin and a second fin;
   a gate stack in contact with a top surface and a sidewall of the first fin;
   a first oxide region disposed in the first layer;
   a second oxide region disposed in the second layer, wherein a first interface defined by the first oxide region and the second oxide region is disposed proximate the first fin; and
   an isolation structure disposed between the first fin and the second fin and overlying the first oxide region and the second oxide region.

2. The semiconductor device of claim 1, wherein the first oxide region comprises at least one of $SiGeO_x$, $SiCO_x$ or $SiPO_x$.

3. The semiconductor device of claim 1, wherein the second oxide region comprises $SiO_x$.

4. The semiconductor device of claim 1, wherein the first oxide region is about 20 to about 50 nm thick.

5. The semiconductor device of claim 1, wherein the second oxide region is greater than 1 nm thick.

6. The semiconductor device of claim 1, wherein the first layer comprises at least one of $SiGe_x$, SiC or SiP.

7. The semiconductor device of claim 1, wherein the second layer comprises Si.

8. The semiconductor device of claim 1, wherein:
   a second interface is defined by the first layer and the second oxide region, and
   a third interface is defined by the first layer and the second layer.

9. A semiconductor device comprising:
   a first layer comprising SiGe;
   a second layer disposed over the first layer, the second layer comprising a doped Si and having a first fin defining a channel between a source region and a drain region of the semiconductor device;
   a first oxide region disposed in the first layer, the first oxide region comprising SiGeOx; and
   a second oxide region disposed in the second layer, the second oxide region comprising SiOx, wherein:
      a first interface defined by the first oxide region and the second oxide region is disposed proximate the first fin,
      a second interface is defined by the first oxide region of the first layer and the SiGe of the first layer; and
      a third interface is defined by the SiGe of the first layer and the second layer.

10. The semiconductor device of claim 9, wherein the first oxide region is about 20 to about 50 nm thick.

11. The semiconductor device of claim 9, wherein the second oxide region is at least 1 nm thick.

12. The semiconductor device of claim 9, wherein the second layer has a second fin, the first interface disposed between the second fin and the first fin.

13. The semiconductor device of claim 12, comprising:
    an isolation structure disposed between the first fin and the second fin and overlying the first oxide region and the second oxide region.

14. A method of forming a semiconductor device comprising:
    forming a first layer over a substrate;
    forming a doped layer over the first layer;
    etching the doped layer to form a first fin and a second fin from the doped layer, the first fin separated from the second fin by an opening formed in the doped layer;
    oxidizing, after the opening is formed, a portion of the first layer to form a first oxide region in the first layer proximate the opening; and
    forming a second oxide region in the doped layer proximate the opening, wherein the first oxide region and the second oxide region are formed concurrently.

15. The method of claim 14, comprising:
    forming an isolation structure in the opening over at least one of the first oxide region or the second oxide region.

16. The method of claim 15, comprising:
    forming a gate stack over at least one of the first fin, the second fin or the isolation structure, the gate stack in contact with the at least one of the first fin, the second fin or the isolation structure.

17. The method of claim 14, the oxidizing comprising:
    exposing the portion of the first layer to an oxidation source at a temperature of about 500° C. to about 600° C.

18. The semiconductor device of claim 1, wherein the second oxide region is not laterally co-planar with the gate stack.

19. The semiconductor device of claim 1, wherein a second interface is defined by the first layer and the first oxide region.

20. The semiconductor device of claim 1, wherein the gate stack is spaced apart from the second oxide region by the isolation structure.

* * * * *